(12) United States Patent
Chang et al.

(10) Patent No.: US 9,324,585 B2
(45) Date of Patent: Apr. 26, 2016

(54) SEMICONDUCTOR PACKAGE AND METHOD OF FABRICATING THE SAME

(71) Applicant: Siliconware Precision Industries Co., Ltd., Taichung (TW)

(72) Inventors: Chiang-Cheng Chang, Taichung (TW); Meng-Tsung Lee, Taichung (TW); Jung-Pang Huang, Taichung (TW); Shih-Kuang Chiu, Taichung (TW); Fu-Tang Huang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 33 days.

(21) Appl. No.: 13/654,754

(22) Filed: Oct. 18, 2012

(65) Prior Publication Data

US 2014/0021629 A1 Jan. 23, 2014

(30) Foreign Application Priority Data

Jul. 19, 2012 (TW) .............................. 101125979 A

(51) Int. Cl.
| | |
|---|---|
| H01L 23/48 | (2006.01) |
| H01L 23/52 | (2006.01) |
| H01L 29/40 | (2006.01) |
| H01L 21/56 | (2006.01) |
| H01L 23/00 | (2006.01) |
| H01L 23/31 | (2006.01) |

(52) U.S. Cl.
CPC ............ *H01L 21/561* (2013.01); *H01L 21/568* (2013.01); *H01L 24/19* (2013.01); *H01L 24/96* (2013.01); *H01L 23/3128* (2013.01); *H01L 2224/0401* (2013.01); *H01L 2224/04105* (2013.01); *H01L 2224/05567* (2013.01); *H01L 2224/12105* (2013.01); *H01L 2224/131* (2013.01); *H01L 2224/24153* (2013.01); *H01L 2924/00014* (2013.01)

(58) Field of Classification Search
USPC ......................................................... 257/774
See application file for complete search history.

(56) References Cited

U.S. PATENT DOCUMENTS

| | | | | |
|---|---|---|---|---|
| 6,154,366 | A * | 11/2000 | Ma et al. ........................ | 361/704 |
| 6,902,950 | B2 * | 6/2005 | Ma et al. ........................ | 438/106 |
| 7,655,501 | B2 * | 2/2010 | Yang et al. ..................... | 438/106 |
| 2007/0085188 | A1 * | 4/2007 | Chang ................ | H01L 23/5389 257/686 |
| 2007/0181995 | A1 * | 8/2007 | Hsu ..................... | H01L 23/5384 257/700 |
| 2011/0241222 | A1 * | 10/2011 | Sezi et al. ..................... | 257/782 |

* cited by examiner

*Primary Examiner* — Marc Armand
*Assistant Examiner* — Wilner Jean Baptiste
(74) *Attorney, Agent, or Firm* — Mintz Levin Cohn Ferris Glovsky and Popeo, P.C.; Peter F. Corless; Steven M. Jensen

(57) ABSTRACT

A method of fabricating a semiconductor package is provided, including: disposing a plurality of semiconductor elements on a carrier through an adhesive layer in a manner that a portion of the carrier is exposed from the adhesive layer; forming an encapsulant to encapsulate the semiconductor elements; removing the adhesive layer and the carrier to expose the semiconductor elements; and forming a build-up structure on the semiconductor elements. Since the adhesive layer is divided into a plurality of separated portions that will not affect each other due to expansion or contraction when temperature changes, the present invention prevents positional deviations of the semiconductor elements during a molding process, thereby increasing the alignment accuracy.

5 Claims, 6 Drawing Sheets

SEMICONDUCTOR PACKAGE AND METHOD OF FABRICATING THE SAME

CROSS-REFERENCES TO RELATED APPLICATIONS

This application claims under 35 U.S.C. §119(a) the benefit of Taiwanese Application No. 101125979, filed Jul. 19, 2012, the entire contents of which is incorporated herein by reference.

BACKGROUND OF THE INVENTION

1. Field of the Invention

The present invention relates to semiconductor packages and methods of fabricating the same, and, more particularly, to a flip-chip semiconductor package and a method of fabricating the same.

2. Description of Related Art

Along with the rapid development of electronic industries, electronic products are developed towards miniaturization, multi-function, high electrical performance and high speed. For example, along with integration of fabrication processes of front-end semiconductor chips, electrode pads of high density are provided on active surfaces of semiconductor chips to serve as I/O terminals. Accordingly, semiconductor packages such as fan out wafer-level chip-scaled packages that have interconnection structures for fanning out signals from the electrode pads have been developed.

To form such a semiconductor package, semiconductor elements such as semiconductor chips are disposed on a carrier and encapsulated by an encapsulant, and subsequently the carrier is removed so as to form interconnection structures on the semiconductor elements. Referring to FIG. 3A, an adhesive layer 32 is formed on an entire surface of the carrier 30. Then, a plurality of semiconductor elements 36 are disposed on the adhesive layer 32 at predefined positions A. Thereafter, referring to FIG. 3B, an encapsulant 37 is formed on the adhesive layer 32 to encapsulate the semiconductor elements 36. However, the adhesive layer 32 easily expands or contracts when temperature changes during a molding process, thus causing deviations of the semiconductor elements 36 from the predefined positions A and adversely affecting alignment accuracy in the molding process and subsequent processes. Hence, for example, build-up structures formed on the semiconductor elements cannot be electrically connected to the semiconductor elements, thus reducing the product yield.

Therefore, there is a need to provide a semiconductor package and a fabrication method thereof so as to overcome the above-described drawbacks.

SUMMARY OF THE INVENTION

In view of the above-described drawbacks, the present invention provides a semiconductor package, which comprises: an encapsulant having opposite top and bottom surfaces; at least a semiconductor element embedded in the encapsulant, wherein the semiconductor element has opposite first and second surfaces, and the first surface of the semiconductor element is exposed from the bottom surface of the encapsulant; a polymer layer formed between the semiconductor element and the encapsulant and extending on the bottom surface of the encapsulant; and a build-up structure formed on the first surface of the semiconductor element.

The present invention further provides a method of fabricating a semiconductor package, which comprises: providing a carrier having at least a semiconductor element disposed on a surface thereof, wherein the semiconductor element is attached to the carrier through an adhesive layer in a manner that a portion of the surface of the carrier is exposed from the adhesive layer; forming an encapsulant on the carrier to encapsulate the semiconductor element, wherein the encapsulant has opposite top and bottom surfaces, and the bottom surface of the encapsulant is in contact with the carrier; removing the adhesive layer and the carrier such that a surface of the semiconductor element is exposed from the bottom surface of the encapsulant; and forming a build-up structure on the exposed surface of the semiconductor element.

In an embodiment, before forming the encapsulant, the method further comprises forming a polymer layer on exposed surfaces of the carrier and the semiconductor element so as for the encapsulant to be formed on the polymer layer.

In an embodiment, disposing the semiconductor element on the carrier comprises: forming an adhesive layer on the entire surface of the carrier; disposing the semiconductor element on the adhesive layer, with a portion of the adhesive layer exposed from the semiconductor element; and removing the exposed portion of the adhesive layer.

In an embodiment, before disposing the semiconductor element on the adhesive layer, the method further comprises covering a portion of the adhesive layer with a mask such that the remaining portion of the adhesive layer used for disposing the semiconductor element is exposed from the mask; and exposing the remaining portion of the adhesive layer to light.

Therefore, by dividing an adhesive layer into a plurality of separated adhesive units, the present invention prevents the adhesive units from affecting each other due to expansion or contraction when temperature changes. Further, by forming a polymer layer on the exposed surfaces of the carrier and the semiconductor element, the position of the semiconductor element is fixed such that no positional deviation occurs during a molding process, thereby increasing the alignment accuracy and improving the product yield.

BRIEF DESCRIPTION OF DRAWINGS

FIGS. 1F' to 1I' show another embodiment of FIGS. 1F to 1I.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms, such as "top", "bottom", "first", "second", "a" etc., are merely for illustrative purpose and should not be construed to limit the scope of the present invention.

FIGS. 1A to 1I are schematic cross-sectional views showing a method of fabricating a semiconductor package according to a first embodiment of the present invention. FIGS. 1A to 1D show a method for disposing semiconductor elements on a surface of a carrier. The semiconductor elements are attached to the carrier through an adhesive layer and a portion of the surface of the carrier is exposed from the adhesive layer.

Figure 1A:
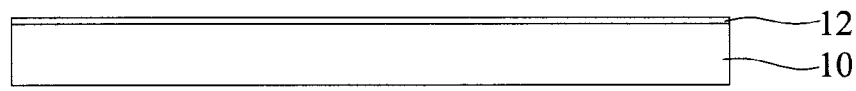
FIGS. 1A to 1I are schematic cross-sectional views showing a method of fabricating a semiconductor package according to a first embodiment of the present invention.

Referring to FIG. 1A, an adhesive layer 12 is formed on an entire surface of a carrier 10 such as a substrate.

Figure 1B:
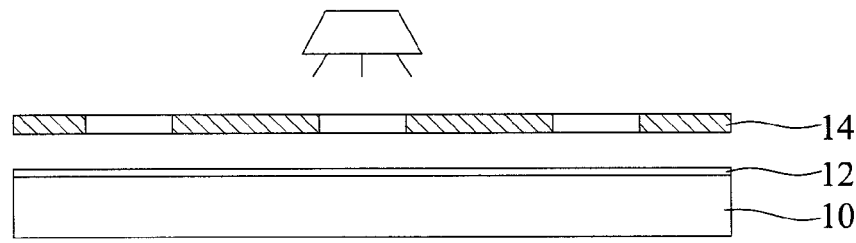

Subsequently, referring to FIG. 1B, a mask 14 is provided to cover a portion of the adhesive layer 12 while the remaining portion of the adhesive layer 12 used for disposing semiconductor elements are exposed from the mask 14. Further, the remaining portion of the adhesive layer 12 used for disposing the semiconductor elements are exposed to light. In an embodiment, the adhesive layer 12 is made of a photosensitive adhesive such as a UV polymerizable material. As such, non-illuminated portions of the adhesive layer 12 can be removed by a cleaning or developing solution.

Figure 1C:
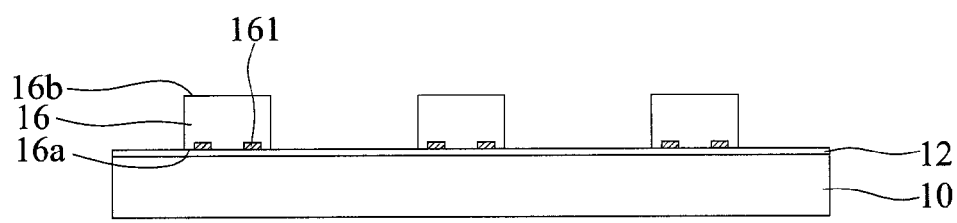

Referring to FIG. 1C, a plurality of semiconductor elements 16 are disposed on the adhesive layer 12 at predefined positions. In an embodiment, three semiconductor chips are disposed on the adhesive layer 12 at predefined positions. But it should be noted that the present invention is not limited thereto. Each of the semiconductor elements 16 has a first surface 16a with a plurality of electrode pads 161 and a second surface 16b opposite to the first surface 16a.

Figure 1D:
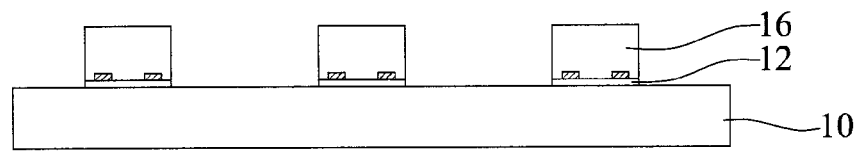

Referring to FIG. 1D, a portion of the adhesive layer 12 that is not covered by the semiconductor elements 16 is removed. As such, the adhesive layer 12 only exists between the carrier 10 and the semiconductor elements 16.

Figure 1E:
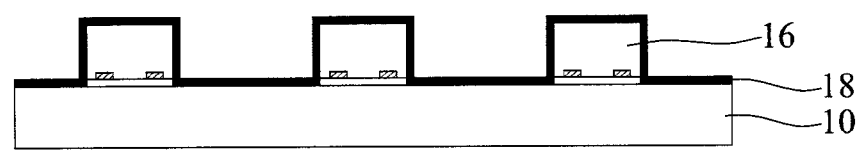

Referring to FIG. 1E, a polymer layer 18 made of polyimide, for example, is formed on exposed surfaces of the carrier 10 and the semiconductor elements 16.

Figure 1F:
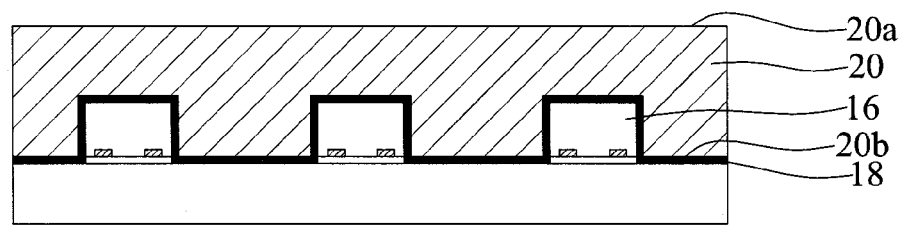
Figure 1F:
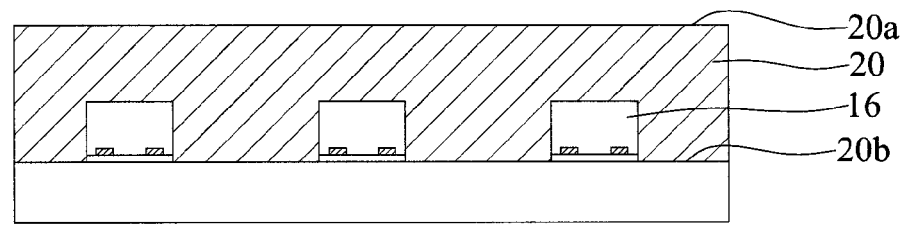

Referring to FIG. 1F, by performing a molding process, an encapsulant 20 is formed on the polymer layer 18 for encapsulating the semiconductor elements 16. The encapsulant 20 has a top surface 20a and a bottom surface 20b opposite to the top surface 20a and in contact with the polymer layer 18. Since the adhesive layer 12 between the semiconductor elements 16 is removed and the polymer layer 18 is formed on the exposed surfaces of the carrier 10 and the semiconductor elements 16 (including the second surfaces 16b and side surfaces of the semiconductor elements 16), the semiconductor elements 16 can be securely fixed on the carrier 10, thereby preventing positional deviations of the semiconductor elements 16 during a molding process, increasing the alignment accuracy and improving the product yield.

Referring to FIG. 1F', in an alternative embodiment, the encapsulant 20 is directly formed on the carrier 10 of FIG. 1D. Since the adhesive layer 12 only exists between the carrier 10 and the semiconductor elements 16, the present invention overcomes the conventional drawback of positional deviations of the semiconductor elements 16 caused by expansion or contraction of the adhesive layer 12 between the semiconductor elements 16, thereby increasing the alignment accuracy during subsequent processes.

Figure 1G:
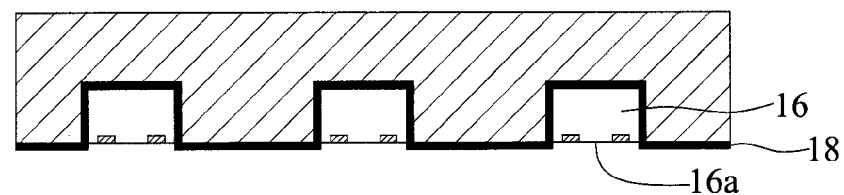
Figure 1G:
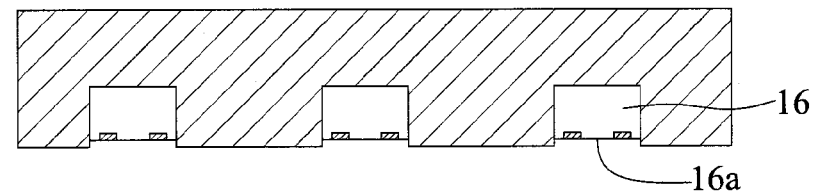

Referring to FIG. 1G the adhesive layer 12 and the carrier 10 are removed by a mechanical method and/or a chemical method such that the first surfaces 16a of the semiconductor elements 16 are exposed from the polymer layer 18.

Referring to FIG. 1G', continued from FIG. 1F', the first surfaces 16a of the semiconductor elements 16 are exposed from the bottom surface 20b of the encapsulant 20.

Figure 1H:
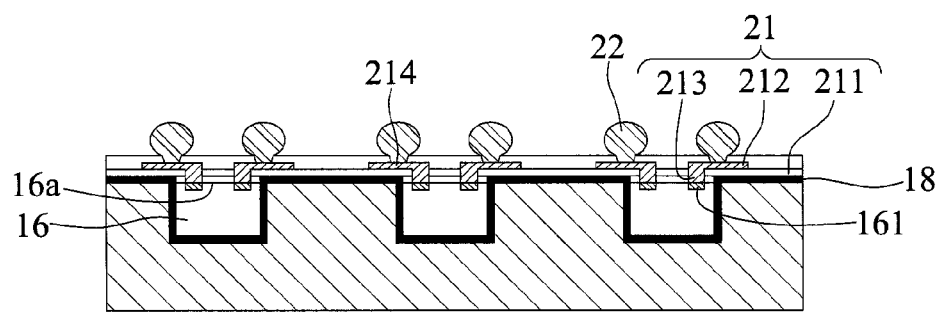
Figure 1H:
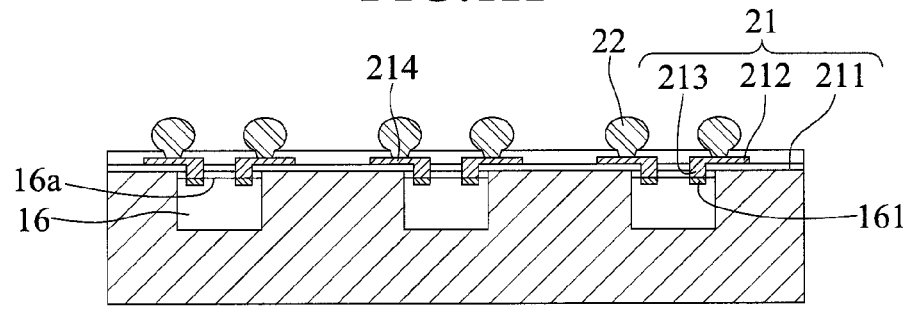

Referring to FIG. 1H, a build-up structure 21 is formed on the first surfaces 16a of the semiconductor elements 16. The build-up structure 21 has at least a dielectric layer 211, a circuit layer 212 formed on the dielectric layer 211, and a plurality of conductive vias 213 formed in the dielectric layer 211 for electrically connecting the circuit layer 212 and the electrode pads 161.

The outermost circuit layer 212 of the build-up structure 21 further has a plurality of conductive pads 214 so as for a plurality of conductive elements 22 such as solder balls to be formed thereon.

Figure 1I:
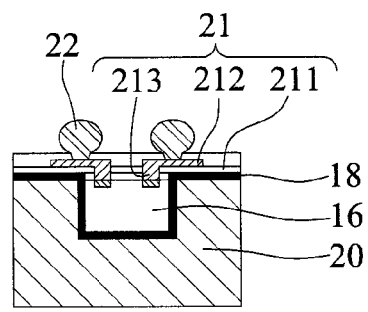
Figure 1I:
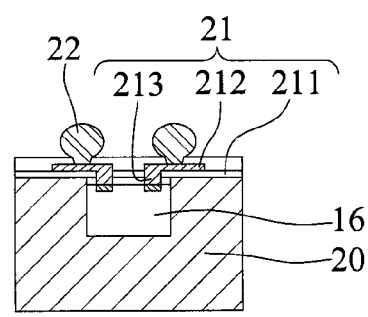

Then, a singulation process is performed to obtain a plurality of semiconductor packages, as shown in FIG. 1I.

Referring to FIGS. 1H' and 1I', continued from FIG. 1G', a semiconductor package without a polymer layer is obtained.

FIGS. 2A to 2F are schematic cross-sectional views showing a method of fabricating a semiconductor package according to a second embodiment of the present invention.

Figure 2A:
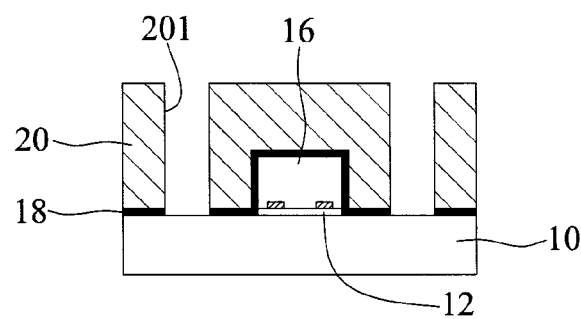
FIGS. 2A to 2F are schematic cross-sectional views showing a method of fabricating a semiconductor package according to a second embodiment of the present invention.

Referring to FIG. 2A, continued from FIG. 1F, before removing the adhesive layer 12 and the carrier 10, a plurality of through holes 201 are formed at positions close to the semiconductor elements 16 and penetrate the encapsulant 20 and the polymer layer 18. If continued from FIG. 1F', the through holes 201 only penetrate the encapsulant 20.

Figure 2B:
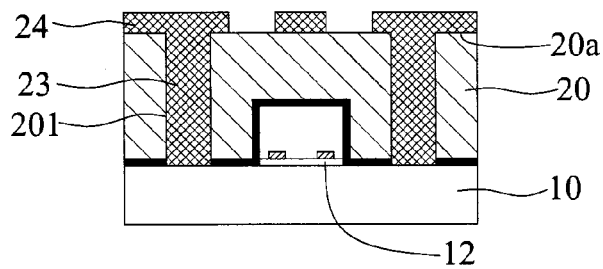
Figure 2C:
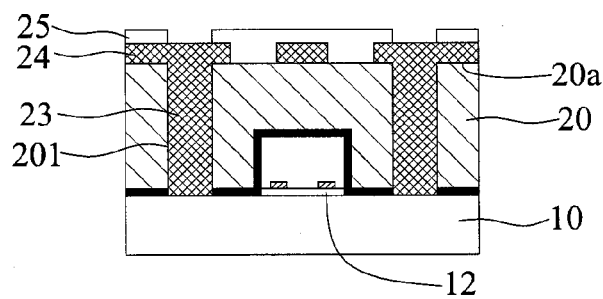

Referring to FIGS. 2B and 2C, a plurality of conductive posts 23 are formed in the through holes 201, and a plurality of conductive traces 24 are formed on the top surface 20a of the encapsulant 20 for electrically connecting the conductive posts 23. In particular, a seed layer (not shown) is formed on the encapsulant 20 and inner walls of the through holes 201, and then an electroplating process is performed to form the conductive posts 23 in the through holes 201. In a similar manner, the conductive traces 24 are formed on the top surface 20a of the encapsulant 20 by electroplating.

Referring to FIG. 2C, an insulating layer 25 is formed on the top surface 20a of the encapsulant 20, and the conductive traces 24 and has a plurality of openings for exposing portions of the conductive traces 24.

Figure 2D:
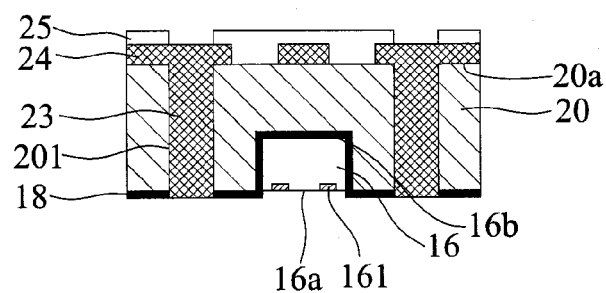

Referring to FIG. 2D, the adhesive layer 12 and the carrier 10 are removed so as to expose the first surfaces 16a of the semiconductor elements 16 from the polymer layer 18.

Figure 2E:
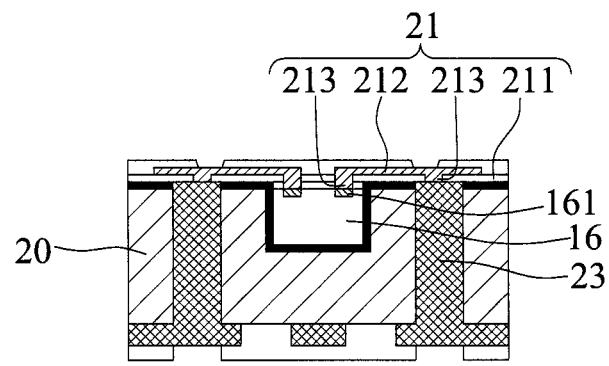

Referring to FIG. 2E, the structure of FIG. 2D is turned over, and a build-up structure 21 is formed on the first surfaces 16a of the semiconductor elements 16. The build-up structure 21 has at least a dielectric layer 211, a circuit layer 212 formed on the dielectric layer 211, and a plurality of conductive vias 213 formed in the dielectric layer 211 for electrically connecting the circuit layer 212, the electrode pads 161 and the conductive posts 23.

Figure 2F:
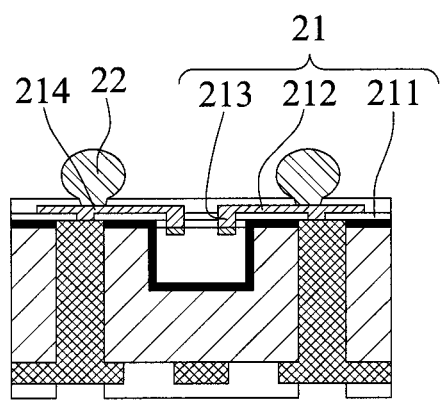
Figure 3A:
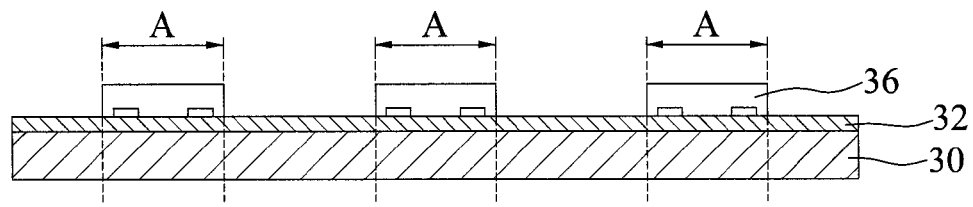
FIGS. 3A and 3B are schematic cross-sectional views showing a method of fabricating a semiconductor package according to the prior art.
Figure 3B:
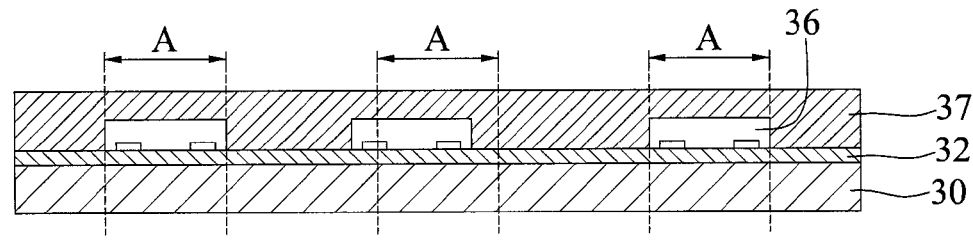

Referring to FIG. 2F, the build-up structure 21 has a plurality of conductive pads 214 so as for a plurality of conductive elements 22 to be formed thereon.

Further, a singulation process is performed to obtain a plurality of semiconductor packages having conductive posts 23. The exposed portions of the conductive traces 24 can be used for connecting other electronic elements such as semiconductor packages.

The present invention further provides a semiconductor package, which has: an encapsulant 20 having opposite top and bottom surfaces 20a, 20b; at least a semiconductor element 16 embedded in the encapsulant 20, wherein the semiconductor element 16 has opposite first and second surfaces 16a, 16b, and the first surface 16a of the semiconductor element 16 is exposed from the bottom surface 20b of the encapsulant 20; a polymer layer 18 formed between the semiconductor element 16 and the encapsulant 20 and extending on the bottom surface 20b of the encapsulant 20, wherein the polymer layer 18 and the first surface 16a of the semiconductor element 16 form a step structure; and a build-up structure 21 formed on the first surface 16a of the semiconductor element 16. The first surface 16a of the semiconductor element 16 has a plurality of electrode pads 161, and the build-up structure 21 has at least a dielectric layer 211, a circuit layer 212 formed on the dielectric layer 211, and a plurality of conductive vias 213 formed in the dielectric layer 211 for electrically connecting the circuit layer 212 and the electrode pads 161. The build-up structure 21 further has a plurality of conductive pads 214 so as for conductive elements 22 to be formed thereon.

In an embodiment, the semiconductor package further has a plurality of through holes 201 formed at positions close to the semiconductor element 16 and penetrating the encapsulant 20 and the polymer layer 18; a plurality of conductive posts 23 formed in the through holes 201; a plurality of conductive traces 24 formed on the top surface 20a of the encapsulant 20 for electrically connecting the conductive posts 23; and an insulating layer 25 formed on the top surface 20a of the encapsulant 20 and the conductive traces 24. In an embodiment, the first surface 16a of the semiconductor element 16 has a plurality of electrode pads 161, and the build-up structure 21 has at least a dielectric layer 211, a circuit layer 212 formed on the dielectric layer 211, and a plurality of conductive vias 213 formed in the dielectric layer 211 for electrically connecting the circuit layer 212, the electrode pads 161 and the conductive posts 23.

According to the present invention, the photosensitive characteristic of the adhesive layer enables the adhesive layer to be divided into a plurality of separated adhesive units, thereby preventing the adhesive units from affecting each other due to expansion or contraction when temperature changes. Further, by forming a polymer layer on the exposed surfaces of the carrier and the semiconductor element, the position of the semiconductor element is fixed such that no positional deviation occurs during a molding process, thereby increasing the alignment accuracy and improving the product yield.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor package, comprising:
   an encapsulant having opposite top and bottom surfaces;
   at least a semiconductor element embedded in the encapsulant, wherein the semiconductor element has opposite first and second surfaces and the first surface of the semiconductor element is exposed from the bottom surface of the encapsulant, wherein the first surface of the semiconductor element is on a lower level than the bottom surface of the encapsulant;
   a polymer layer formed between the semiconductor element and the encapsulant and extending onto the bottom surface of the encapsulant, wherein the polymer layer is formed on the second surface of the semiconductor element and the bottom surface of the encapsulant, and is free from being formed on the first surface of the semiconductor element and wherein the first surface of the semiconductor element and the polymer layer form a step structure; and
   a build-up structure formed on the first surface of the semiconductor element and the polymer layer on the bottom surface of the encapsulant.

2. The semiconductor package of claim 1, wherein the first surface of the semiconductor element has a plurality of electrode pads, and the build-up structure has at least a dielectric layer, a circuit layer formed on the dielectric layer, and a plurality of conductive vias formed in the dielectric layer for electrically connecting the circuit layer and the electrode pads.

3. The semiconductor package of claim 1, wherein the build-up structure has a plurality of conductive pads so as for conductive elements to be formed thereon.

4. The semiconductor package of claim 1, further comprising:
   a plurality of through holes formed at positions close to the semiconductor element and penetrating the encapsulant and the polymer layer;
   a plurality of conductive posts formed in the through holes;
   a plurality of conductive traces formed on the top surface of the encapsulant for electrically connecting the conductive posts; and
   an insulating layer formed on the top surface of the encapsulant and the conductive traces.

5. The semiconductor package of claim 4, wherein the first surface of the semiconductor element has a plurality of electrode pads, and the build-up structure has at least a dielectric layer, a circuit layer formed on the dielectric layer, and a plurality of conductive vias formed in the dielectric layer for electrically connecting the circuit layer, the electrode pads and the conductive posts.

* * * * *